United States Patent

Muhich et al.

[11] Patent Number: 5,668,761
[45] Date of Patent: Sep. 16, 1997

[54] FAST READ DOMINO SRAM

[75] Inventors: John Stephen Muhich; Robert Paul Masleid; Larry Bryce Phillips, all of Austin, Tex.

[73] Assignee: International Business Machines Corporation, Armonk, N.Y.

[21] Appl. No.: 525,935

[22] Filed: Sep. 8, 1995

[51] Int. Cl.⁶ .................................................. G11C 7/00
[52] U.S. Cl. .................. 365/189.05; 365/204; 365/190
[58] Field of Search ........................... 365/203, 189.04, 365/189.05, 230.06, 194, 204, 190

[56] References Cited

U.S. PATENT DOCUMENTS 4,599,708  7/1986  Schuster .................. 365/189.04
5,089,992  2/1992  Shinohara ............. 365/189.04 X
5,453,708  9/1995  Gupta et al. ..................... 326/93
5,517,136  5/1996  Harris et al. ..................... 326/93

Primary Examiner—Joseph A. Popek
Attorney, Agent, or Firm—Benman Collins & Sawyer; Michael A. Davis, Jr.

[57] ABSTRACT

A system and method is disclosed for increasing read performance of domino SRAMS. A conventional word-line, which drives two transistors per cell, is replaced with two separate word-lines. The first word-line drives one transistor and the second word-line drives the other transistor. The first word-line is used to write zeros into cells, while the second word line is used to both write ones into cells and to read the contents of the cells. Since the second word-line drives only one transistor during read operations, one-half of the gate load on the write/read word-line is eliminated.

7 Claims, 2 Drawing Sheets

FAST READ DOMINO SRAM

CROSS-REFERENCE TO RELATED APPLICATIONS

The present application is related to application Ser. No. 08/525,939 entitled "High Speed SRAM With OR-Gate Sense" filed on the same date as the present application and assigned to the assignee of the present application.

FIELD OF THE INVENTION

The present invention relates to random access memories in microprocessor applications, and more particularly to a system and method for increasing the read performance of a static random access memory, while decreasing power consumption.

BACKGROUND OF THE INVENTION

Power conservation is a major design objective, even in high performance circuits. High speed embedded static random access memories (SRAMs) in current superscalar processors are struggling to keep up with the processors due to rapidly decreasing processor cycle times and to restrictions on power consumption. As processor designs increase in both the degree of scalarity (number of execution units) and word size, embedded cache SRAMs are both limiting processor speed (or decreasing throughput as latency increases) and contributing significantly to such a chip's power consumption.

The limitations associated with SRAMs are primarily due to conventional SRAM design. A SRAM typically comprises an array of cells. The cells in each column of the array are coupled by two lines, known as bit lines, to a sense amplifier, which reads the information stored in the cells by sensing a small differential voltage across the bit-line pair.

Traditional SRAM designs create several power consumption issues. First, wide line sizes comprising the SRAM circuits greatly increase power consumption by requiring many more sense amplifiers, and also take away design freedom. Second, sense amplifiers dissipate a significant amount of power because the transistors used in differential amplifiers must be placed into a linear operating mode until the voltage difference across the bit-line pair exceeds a predetermined threshold. In addition, due to architectural restrictions, sense amplifiers are becoming more difficult to design; and the traditional method of increasing speed in a SRAM is to increase the power supplied to the sense amplifier.

Accordingly, what is needed is a system and method for providing a RAM structure that uses a sense approach that both increases performance and decreases power consumption. The present invention addresses such a need.

SUMMARY OF THE INVENTION

The present invention is a system and method for increasing the read performance of a static random access memory, wherein the random access memory includes at least one core cell coupled to a local bit line. The system and method further comprises a first transistor, a second transistor coupled to the local bit line, and dual word-line means coupled to the first and second transistor for reading and writing data to the core cell, wherein when reading data from the core cell, the dual word-line means drives only the second transistor, thereby improving the read performance of the domino random access memory.

According to the system and method disclosed herein, one-half of the gate load of a traditional word-line is eliminated, decreasing power consumption of the static random access memory.

DESCRIPTION OF THE INVENTION

The present invention relates to an improvement in random access memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Other types of circuits exist besides those traditionally used to make memory circuits. For example, one type of circuits used to make logic circuits, such as those comprising processor logic, are referred to as dynamic circuits. To clarify that dynamic circuits are different from dynamic type memories, dynamic circuits are referred to here as domino circuits. Domino circuits typically include dynamic nodes that are coupled to a logic tree. During a precharge cycle, the dynamic node is precharged with a voltage, and during an evaluation cycle, the logic tree discharges the dynamic node for evaluation. While domino circuits have long been used to increase performance of logic circuits, they have not traditionally been applied to memory circuits.

Figure 1:
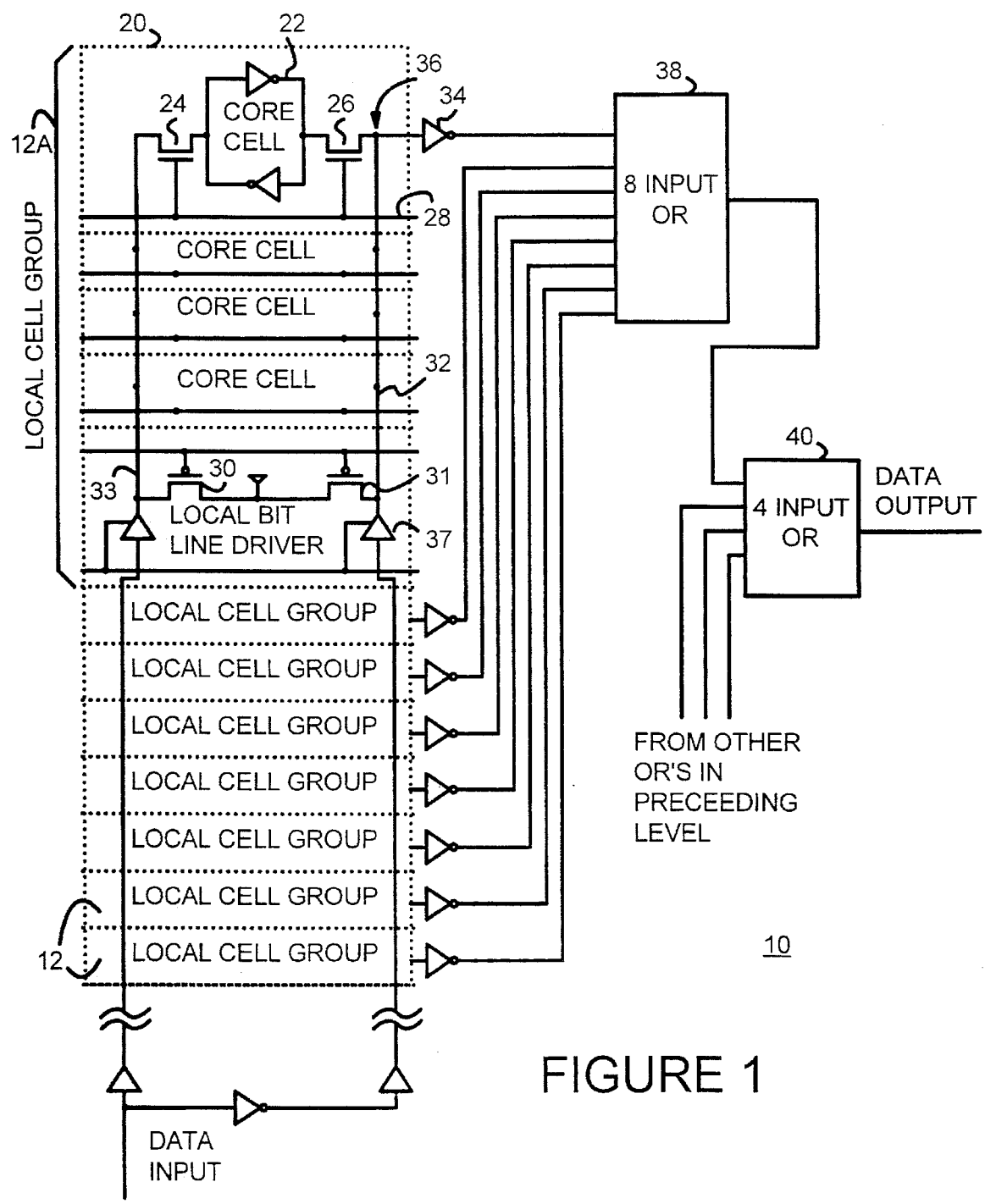
FIG. 1 is a block diagram of a one column array in a prior art SRAM.

Copending application Ser. No. 08/525,939, entitled "High Speed SRAM With OR-Gate Sense" which is herein incorporated by reference, discloses a system and method for combining an SRAM with a domino circuit to provide a domino SRAM that has an OR-gate sense function. Referring to FIG. 1, a high speed domino SRAM 10 is shown, which comprises an array of local cell groups 12. As shown in expanded local cell group 12A, each local cell group 12 includes four core cells 20, and a local bit line driver 37 for writing data into the core cells 20. Rows of core cells 20 formed from adjacent local cell groups 12A in the array constitute a memory word. Each core cell 20 comprising a memory word is coupled to a conventional word line 28. In addition, each core cell 20 in the SRAM 10 includes two transistors 24 and 26 coupled to the word line 28, and a cross-coupled inverter 22 coupled between two transistors 24 and 26.

The SRAM 10 replaces conventional sense amplifiers used in SRAMs by partitioning conventional global bit lines into a local bit line 32 and a local bit line 33 for each of the local cell groups 12. A precharge device 30 is coupled to each one of the local bit lines 33, and a precharge device 31 and a rationed inverter 34 are coupled to each one of the local bit lines 32. The combination of the local bit line 32, the precharge device 31, and the rationed inverter 34 transforms a conventional global bit line into a dynamic node 36 of a domino circuit, and provides the sense function for the cell group 12A. Each of the inverters 34 corresponding to a local cell group 12 are input to an Or-gate tree hierarchy comprising an eight-way input-Or 38 and a four-way input-Or 40 in order to produce output data.

As disclosed in copending application Ser. No. 08/525,939, dynamic logic circuits, such as the domino circuit used in SRAM 10 of the present invention, offer improved performance in many instances over static type structures. However, the word line 28 is loaded with a two gate load per core cell 20, which limits the read performance of the SRAM 10. Read performance is limited because the word line 28 must drive both the transistor 24 and the transistor 26 during a read operation for the entire width of a memory word.

According to the present invention, a conventional word line is replaced by two word lines, one word line to drive transistor 24 and a second word line to drive transistor 26, in order to reduce the gate load by one-half.

Figure 2:
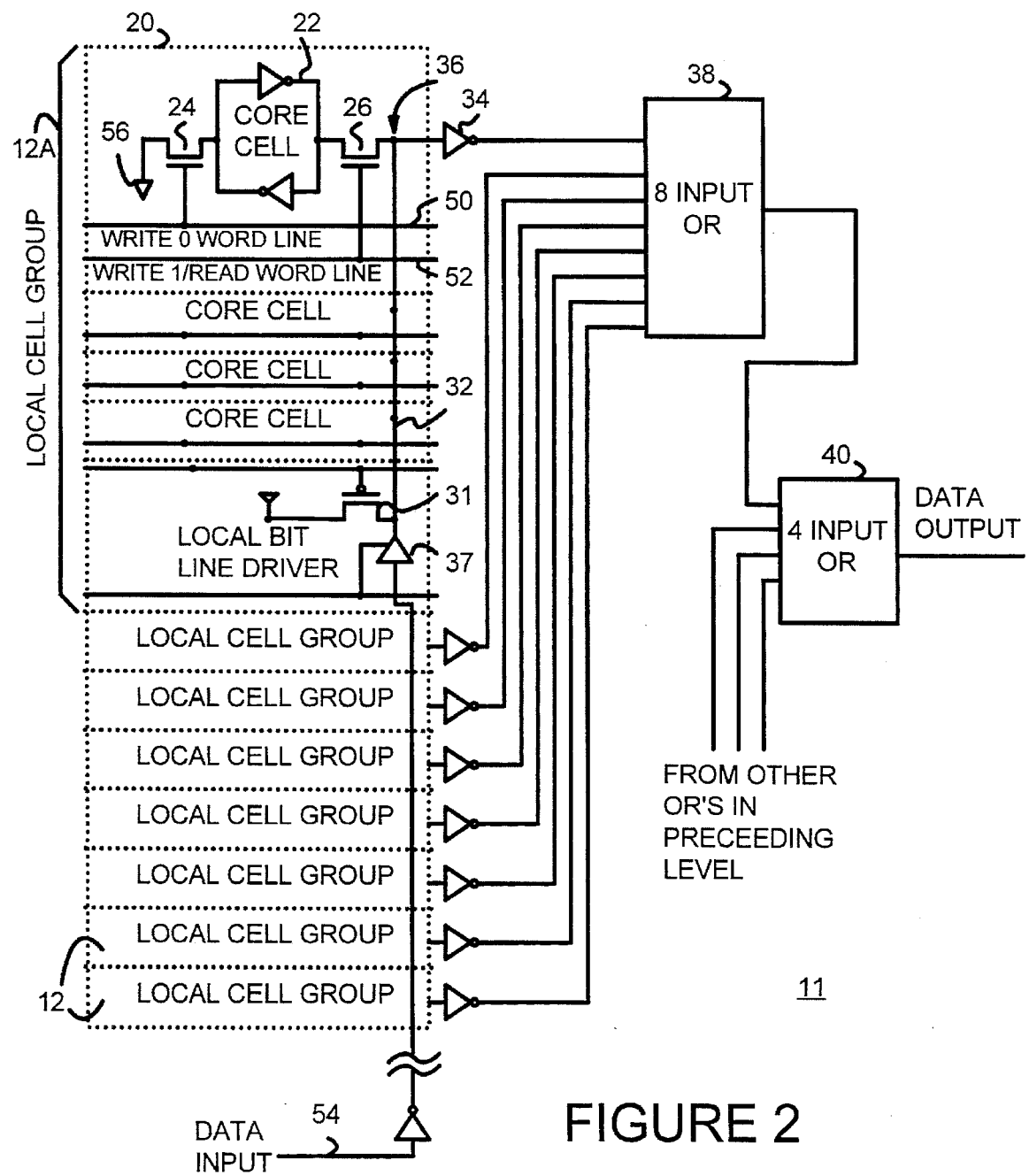
FIG. 2 is a block diagram depicting a fast read domino SRAM of the present invention.

To more particularly illustrate the fast read domino SRAM in accordance with the present invention, refer now to FIG. 2 depicting a block diagram of one embodiment of such a system. In contrast to FIG. 1 in which two global bit lines are partitioned into two local bit lines 32 and 33, the SRAM 11 is shown in FIG. 2 in a second preferred embodiment where one conventional global bit line is eliminated and the other replaced with a local bit line 32 for each local cell group 12A.

According to the present invention, two word lines, rather than one are provided for each core cell 20, a write-0 word-line 50 and a write-1/read word-line 52. The write-0 word-line 50 is used to drive the transistor 24 and, the write-1/read word-line 52 is used to drive the transistor 26.

A core cell is written through the use the write-0 word-line 50, data input line 54, local bit line driver 37, and the local bit line 32. First, the write-0 word-line 50 is activated to cause one side of the core cell 20 to connect to ground 56, which clears the contents of the core cell 20 to binary zero. Activating the write-0 word-line 50 in a particular memory word clears each of the core cells 20 comprising the memory word.

After the contents of the core cell 20 are cleared, binary ones are written into the appropriate core cells 20. This is accomplished by activating the write-1/read word-line 52 to load a binary 1 into those core cells 20 that have a 1 on the data input line 54. The signal on the data input line 54 reaches the local cell group 12A by the local bit line driver 37 and the local bit line 31.

According to the present invention, the write-1/read word-line 52 also reads the contents of a core cell 20 in conjunction with the domino node 36.

A core cell 20 within a local cell group 12A is read by activating the write-1/read word-line 52 for the core cell 20 to be read. This causes the cross-coupled inverter 22 and the transistor 26 associated with the word-line 52 to produce a full swing voltage on the local bit line 32. In response to the full swing voltage produced on the local bit line 32, the dynamic node 36 discharges if a "1" is being read from the core cell 20, producing the Or-function for the domino SRAM.

Although write operations are more complex, the dual word-lines of the present invention provide improved read performance because the write-1/read word-line 52 only has to drive one-half as many transistors as conventional methods, thereby eliminating one-half of the gate load. Therefore, the fast read domino SRAM of the present invention is well suited to read critical applications.

A fast read domino SRAM having dual word-lines per memory word has been disclosed that increases performance while decreasing power consumption of read operations.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A domino random access memory having a core cell coupled to a local bit line, the domino random access memory comprising:

a domino node coupled to the local bit line;

a first transistor;

a first word line coupled to the first transistor;

a second transistor coupled to the local bit line; and a second word line coupled to the second transistor, the first and second word lines for reading and writing data to the core cell, wherein when reading data from the core cell, only the second word-line is activated to drive the second transistor, such that when a binary 1 is read from the core cell, the second word-line and second transistor produce a voltage across the local bit line causing the domino node to discharge.

2. A domino random access memory as in claim 1 wherein the first word-line functions to write a binary zero into the core cell, and the second word-line functions to both write a binary one to the core cell and to read the data in the core cell.

3. A domino random access memory as in claim 2 further including a data input line coupled to the local bit line driver, wherein a binary one is written to the core cell when both the second word-line and the data input line are activated.

4. A method for increasing the read performance of a domino static random access memory, the domino static random access memory including a local bit line coupled between a local cell group and a data input line, the local bit line coupled to at least one core cell for storing data, wherein the at least one core cell includes a first and second transistor, the method comprising the steps of:

(a) coupling a first word-line to the first transistor;

(b) coupling a second word-line to the second transistor;

(c) writing data to the at least one core cell by activating the first word-line; and (d) writing data and reading the data stored in the at least one core cell by activating the second word-line.

5. A method as in claim 4 wherein step (c) further includes the step of:

(c1) writing a binary zero into the at least one core cell by activating the first word-line; and (c2) writing a binary one into the at least one core cell by activating the second word-line and the data input line.

6. A method as in claim 5 wherein a dynamic node is coupled to the local bit line and wherein step (d) further includes the step:

(d1) discharging the dynamic node when a binary one is read from the at least one core cell.

7. A domino random access memory comprising:

a cell group including at least one core cell;

a domino node coupled to the cell group for providing a sense function for the cell group;

the at least one core cell including, a first transistor, a first word line coupled to the first transistor, a second transistor coupled to the domino node, and a second word line coupled to the second transistor, wherein only the first word line is activated to write a binary zero to the core cell, and only the second word-line is activated when reading the core cell, such that when a binary 1 is read from the core cell, the second word-line and second transistor produce a voltage across the local bit line causing the domino node to discharge.

* * * * *